United States Patent [19]
Ishii et al.

[11] Patent Number: 5,361,973
[45] Date of Patent: Nov. 8, 1994

[54] METHOD OF SOLDERING

[75] Inventors: Tadayoshi Ishii; Katsumi Yamada; Kazuyuki Makita, all of Kanagawa, Japan

[73] Assignee: Fuji Electric Co., Ltd., Kanagawa, Japan

[21] Appl. No.: 59,336

[22] Filed: May 11, 1993

[30] Foreign Application Priority Data

May 12, 1992 [JP] Japan ................... 4-117807
Dec. 28, 1992 [JP] Japan ................... 4-347399

[51] Int. Cl.⁵ ............... B23K 31/02; B23K 35/14; B23K 37/04
[52] U.S. Cl. ........................ 228/257; 228/258
[58] Field of Search ............ 228/258, 257, 179.1

[56] References Cited

U.S. PATENT DOCUMENTS 3,327,892  6/1967  Lloyd et al. .................. 228/258
3,805,373  4/1974  Savolainen et al. ........... 228/258
5,172,852  12/1992  Bernardoni et al. ........... 228/258

FOREIGN PATENT DOCUMENTS 1-176681   7/1989   Japan ................. 228/179.1
2-307667   12/1990  Japan ................. 228/179.1
946344     1/1964   United Kingdom .
1122238    7/1968   United Kingdom .
1202227    8/1970   United Kingdom .
1343065    1/1974   United Kingdom .
2126298    3/1984   United Kingdom .

*Primary Examiner*—P. Austin Bradley
*Assistant Examiner*—Jeffrey T. Knapp
*Attorney, Agent, or Firm*—Finnegan, Henderson, Farabow, Garrett & Dunner

[57] ABSTRACT

A solder is disposed outside a joint area without putting a solder foil in an area to be joined or performing preparatory soldering, and soldering is performed by making the melted solder permeate the joint area by a capillary phenomenon. Further, one member is supported by a solder, and a joint solder layer of desired thickness is obtained by use of a jig for supporting the one and the other member at a predetermined distance therebetween when the solder is melted. Further, if a solder outside a joint area is made to stand vertically in its longitudinal direction, and melted at such a state, pressure caused by self-weight is given to the melted solder, and oxide of the solder surface is separated from the melted solder, so that it is possible to further reduce the generation of voids.

8 Claims, 6 Drawing Sheets

METHOD OF SOLDERING

BACKGROUND OF THE INVENTION

The present invention relates to a method of soldering, which is applied to joining of a silicon blank body to a substrate in a process of manufacturing semiconductor elements such as power transistors and the like.

Recently there is a strong tendency to make small electronic parts such as power transistors and the like, and such electronic parts are often used to the maximum of their rated values. It is therefore necessary to avoid increasing the value of thermal resistance due to faults such as voids or the like in a joint portion. Conventionally the joint between an Si chip and a base substrate has been performed by soldering in a mixture gas of hydrogen and nitrogen. In such a case, a solder is supplied as a form of a foil by inserting between the Si chip and the base substrate.

As a result of X-ray transmission tests for inquiring an Si chip and a substrate as a base joined in the above-mentioned method, it was found that there was a void rate about 10% relative a joint area. In order to reduce such a high void rate, there is a method in which a solder foil is put on at least one side of a surface soldered of the Si chip and a portion of the substrate on which the chip is soldered, and the solder foil is heated without contact each other so as to be melted in a mixture gas of hydrogen and nitrogen to perform preliminary soldering, and thereafter a combination of the Si chip with the substrate is heated to be melted again to perform soldering. However, in such a method of soldering after preparatory soldering, there has been a limit in the void rate reduced to about half of that in the above-mentioned method of soldering. The void rate 5% is usually detected as a fault in thermal resistance, and the fraction defective reaches to 10 to 15%. However, if voids of 5% are scattered all over the area of the soldered surface of an Si chip, such a product may be a non-defective one. If such a product is offered to the market, the deterioration of the soldering portion is accelerated by power or heat cycles, so that its life becomes shorter than that of a normal product to thereby lower the reliability.

SUMMARY OF THE INVENTION

It is an object of the present invention to provide a method of soldering in which the above problems are solved so that generation of voids is reduced and a lowering of the yield in manufacturing by faults in thermal resistance is prevented so that it is possible to manufacture semiconductor elements having high reliability.

In order to attain the foregoing object, the method of soldering according to the present invention is provided with that two members are placed so that their surface to be joined are facing to each other, a solder is disposed on one of outer sides of the areas to be joined, the solder is heated to be melted, and the melted solder is cooled to be solidified after making the melted solder permeate the areas to be joined. Effectively, the surfaces to be joined are substantially horizontally held, the solder is held in a manner so that its longitudinal direction is substantially vertical, and the solder is melted in such a state so that a pressure due to self-weight of the solder is exerted to the melted solder. Effectively, the two members are supported with a predetermined distance kept therebetween at least after the melted solder permeates the areas to be joined, and at this time, heating is performed after one of the two members is supported above the other member with a solder disposed therebetween so that a distance larger than the predetermined distance is kept between the members. Effectively, the distance between the two members are restrained so that it becomes beyond a predetermined size when the melted solder the quantity of the disposed solder is made more than the quantity of solidified solder having a volume equivalent to the product of a predetermined distance between the two members and an area of a joint portion.

When a solder existing on one portion of outer sides of an area thus joined is melted, the melted solder permeates the area to be joined by a capillary phenomenon and an effect of wetness of the solder to the surface to be joined. Consequently the movement direction of the air which has been between the both members becomes constant so that the air gets out of the area to be joined through portions in which there is no solder to thereby make it possible to prevent formation of voids because of mixing of the air into the melted solder.

Further, in a case that the surfaces to be joined are made horizontal, and the solder is held in such a manner that a longitudinal direction of the solder is disposed in a vertical direction of the surfaces by holder, when the solder is melted in such a state, oxide contained in the solder is separated from the solder by the difference of specific gravities and condensed in the upper portion of the solder. Only the pure solder permeates the space between the both members under the pressure exerted to the solder by its own weight, so that it is possible to realize the joint in which there are quite a little voids.

PREFERRED EMBODIMENT OF THE PRESENT INVENTION

Examples of the present invention will be described with reference to the drawings.

The three kinds solder materials were applied belonging to high-temperature solders, which were all linear solders of the same diameter 1.6 mm.

(a) 98% Pb-2% Sn (melting point 322° C.)
(b) 95% Pb-5% Sn (melting point 314° C.)
(c) 93.5% Pb-5% Sn-1.5% Ag (melting point 296° C.)

Figure 1:
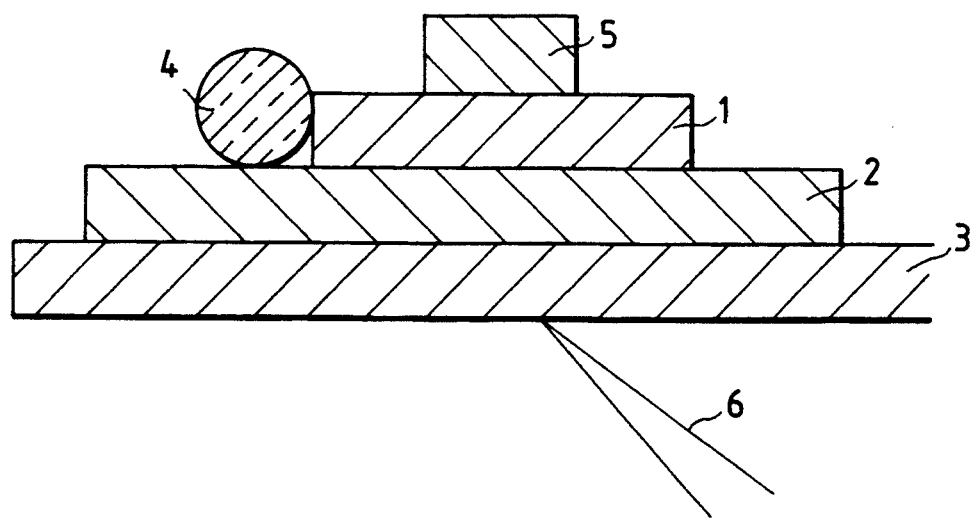
FIG. 1 is a sectional view illustrating a method of soldering according to a first example of the present invention.

In a first example shown in FIG. 1, an Si chip 1 of a size of 19 mm × 15 mm is mounted on a substrate 2 as a base disposed on a jig 3, and a linear solder 4 of a length of 15 mm is put on one portion of the outer sides of the chip 1. Three layers of Au, Ni and Ti are evaporated on the surface to be soldered of the Si chip 1. On the other hand, the substrate 2 consists of Cu, and non-electrolytic Ni plating of a thickness of 3 $\mu$m is provided on the surface. A stainless-steel weight 5 of a weight 10 g was put on the Si chip 1 in order to prevent displacement of the Si chip due to vibration at the time of soldering. Soldering was performed in a transparent quartz tube having an inner diameter of 80 mm, and heating was performed from the outside of the transparent quartz tube by use of an electric furnace. At the time of soldering, gases were supplied to the transparent quartz tube with the total flow rate of 4 l/min, that is, the sum of the flow rate of 2 l/min of hydrogen and the flow rate of 2 l/min of nitrogen. As a result of continuous measurement of the concentration of oxygen and the dew point as impurities in the gases supplied to the transparent quartz tube at that time including the duration of soldering, the concentration of oxygen was 0.5 ppm, and the dew point was −70° C. on an inlet of the transparent quartz tube. On the other hand, the concentration of oxygen before increasing temperature was 1.5 ppm on an outlet of the transparent quartz tube, but oxygen was not detected in the temperature region not less than 150° C. And the dew point was always not higher than −60° C.

Soldering temperature measured by a thermocouple 6 had peak values for the three kinds of solders, that is, the melting point +30° C., the melting point +50° C., and the melting point +80° C. respectively. The time necessary for the temperature to reach the peak value was 25 minutes. As a result of observation of sections at soldered portions by using a metal microscope, the thickness of solder layers was in a range of from 8 to 15 $\mu$m.

Figure 2:
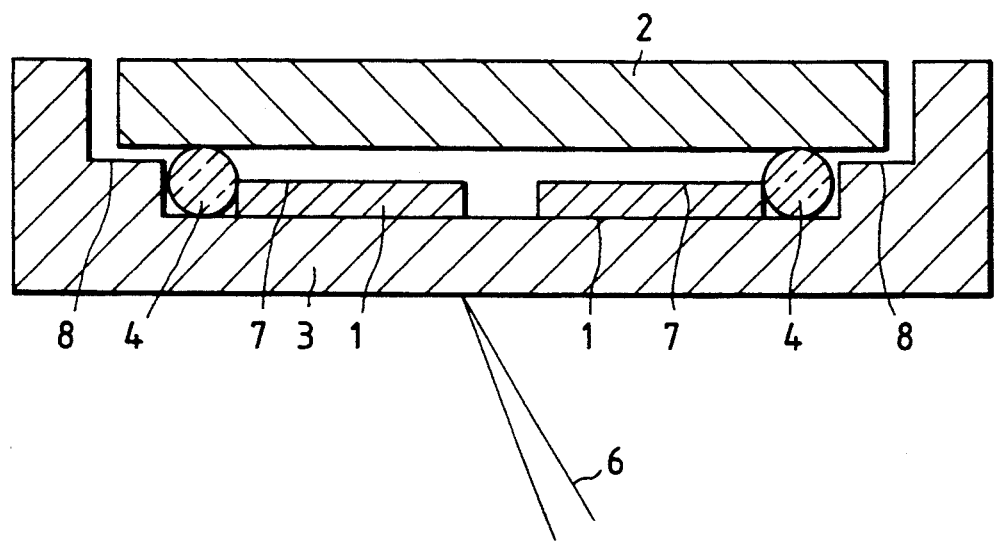
FIG. 2 is a sectional view illustrating a method of soldering according to a second example of the present invention.

A second example shown in FIG. 2 is a method by which it is possible to solder with the thickness of a solder layer suitable to a power-cycle proof characteristic. That is, the target value of the thickness of a solder layer was made 100 $\mu$m, and therefore a jig having a step 8 in the position 100 $\mu$m higher than a soldered surface 7 of an Si chip 1, which is positioned on the side of the jig in this case, was used as a jig 3. The material of the jig 3 was stainless steel. If soldering is performed with the same solder material, Si-chip, atmospheric gas, and heating conditions as in the first example, when the temperature of a solder 4 has reached a value not lower than its melting point, the solder 4 permeates the space between the Si chip 1 and a substrate 2 by a capillary phenomenon and an effect of wetness of the solder with the metal surface of the joint portion, and at the same time the substrate 2 sinks to the step portion 8 of the jig 3 so that it is possible to obtain a desired thickness of the solder. The length of the solder layer 4 was selected to be two kinds of values of 15 mm corresponding to the thickness of a solder layer of 100 $\mu$m, and an excessive value of 20 mm. The weight 5 was not used in this example since the substrate 2 per se acted as a weight. As a result of observation upon sections by using a metal microscope in the same manner as in the first example, the thickness of the solder layer was in a range of from 93 to 110 $\mu$m. It was found that this scattering was caused by the accuracy of the jig.

Figure 3:
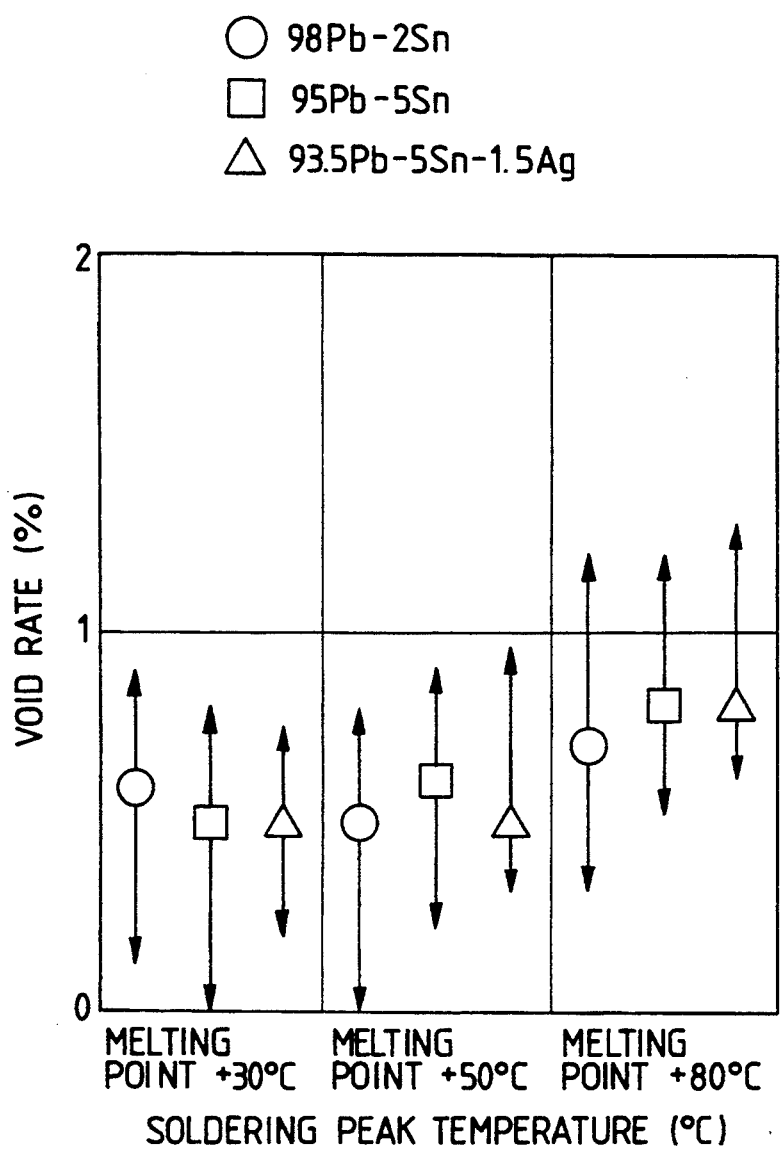
FIG. 3 is a distribution diagram of void rates of joint portions according to the first example.
Figure 4:
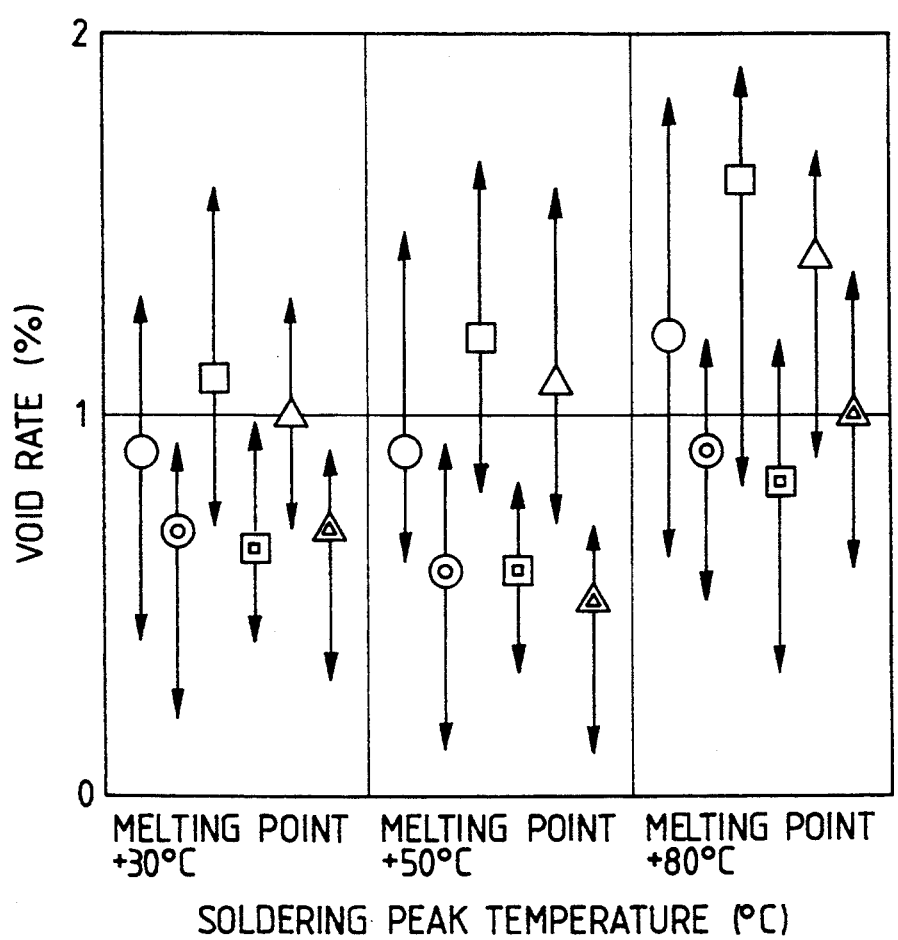
FIG. 4 is a distribution diagram of void rates of joint portions according to the second example.

FIGS. 3 and 4 show the results of measurement of the void rates at joint portions obtained by the first and second examples respectively. Voids were inquired through X-ray transmission tests, and calculated as a rate of the total void area relative to the soldered area of the Si chip 1. Points plotted in the drawings represent average values of 20 samples which were measured, and the upward and downward arrows of each plotted point represent the maximum and minimum of the void rates. From FIG. 3, the void rates, including the maximum void rates, in which the peak temperature of soldering is up to the melting point of plus 50° C., are not more than 1% in each solder, but the maximum void rates in all the solders are beyond 1% if the peak temperature of soldering is the melting point of plus 80° C. The reason is that a capillary phenomenon takes place rapidly because of high temperature of soldering, so that oxide in the surface of the solder is caught into the soldering portion to thereby increase the void rate. This phenomenon is also seen in FIG. 4. In FIG. 4, the void rates in all the solders are beyond 1% in the case of the solder length of 15 mm which is approximate to the proper quantity to the volume of the soldering portion. Further, a solder nearly reaching the void rate of 2% can be seen in the peak temperature of soldering melting point plus 80° C. On the contrary, the void rates including the maximum void rates are not more than 1% in the case of the solder length 20 mm.

Figure 5:
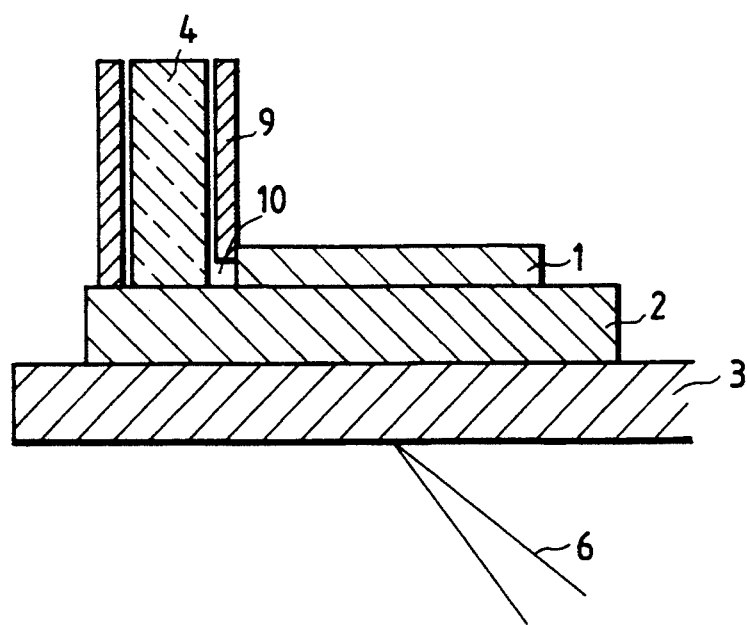
FIG. 5 is a sectional view illustrating a method of soldering according to a third example of the present invention.

In a third example shown in FIG. 5, a stainless steel jig 9 storing a solder is put outside an Si chip 1 which is disposed on a substrate 2, and a linear solder 4 of a length of 20 mm is held to stand vertically in a longitudinal hole of an inner diameter of 1.8 mm. An opening portion 10 is opened, on the chip 1 side, in the lower end of the jig 9. In the same manner as in the first and second examples, soldering is performed in a transparent quartz tube in which a mixture gas of hydrogen and nitrogen is flowed, and the process of heating is made also in the same manner. If the solder 4 reaches to its melting point or more, the solder is pushed out from the opening portion 10 of the solder standing jig 9 by self-weight of the solder, the solder 4 reaching to the surface to be soldered permeates the space between the Si chip 1 and a substrate 2 by a capillary phenomenon and an effect of wetness of the solder with the metal surface of a solder joint portion to thereby form a joint. As a result of observation upon sections after joint by using a metal microscope, inclined joints formed with a solder layer thickness in a range of from several decades to 200 $\mu$m were observed.

Figure 6:
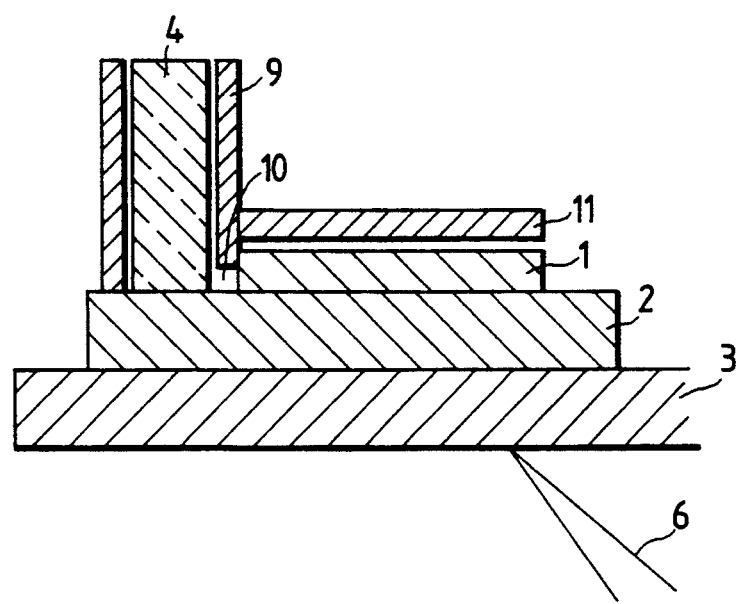
FIG. 6 is a sectional view illustrating a method of soldering according to a fourth example of the present invention.

FIG. 6 shows a fourth example of the present invention for making the joint thickness uniform, in which a stopper 11 is provided at a position 100 $\mu$m immediately upper than an Si chip 1 in order to attain the target solder thickness of 100 $\mu$m. If soldering is performed with such an apparatus under the same conditions as in the third example, the Si chip 1 pushed up by melted solder rises up to the stopper 11, and stops there, so that the desired solder thickness of 100 $\mu$m can be obtained. As a result of observation upon the sections by using a metal microscope in the same manner as in the third example, the thickness of the solder layer was in a range of from 92 to 108 $\mu$m. It was found that this scattering was caused by the accuracy of the jig.

Figure 7:
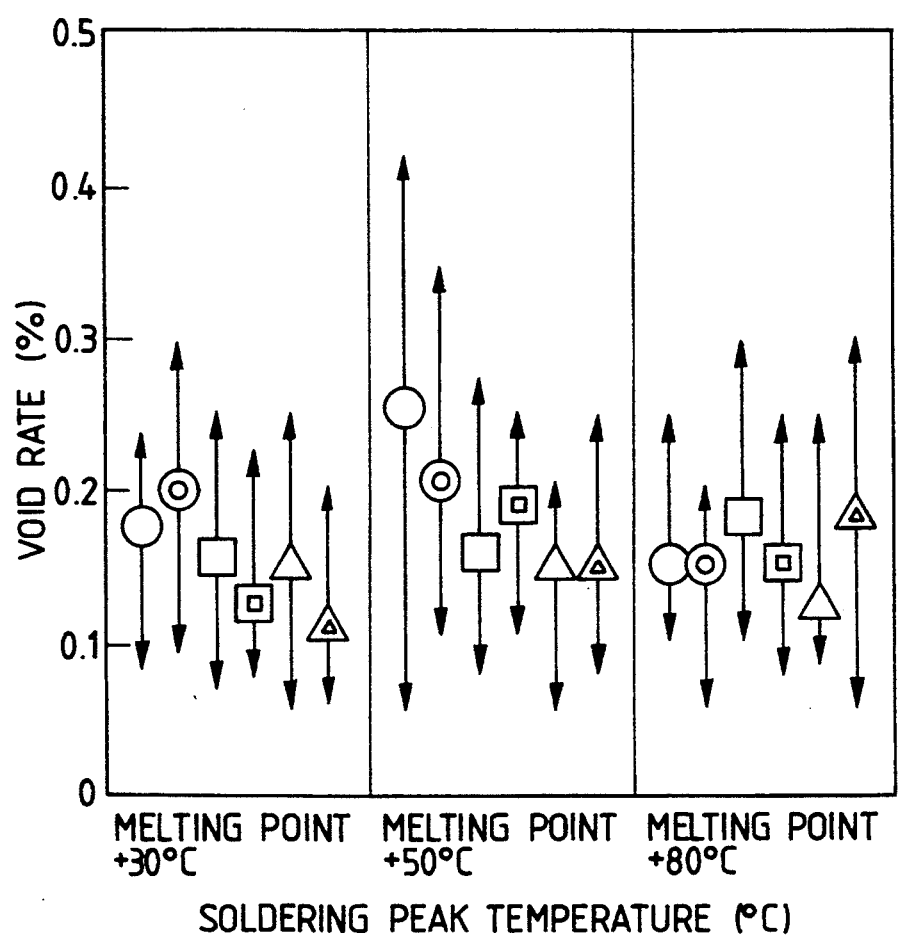
FIG. 7 is a distribution diagram of void rates of joint portions according to the third example.
Figure 8:
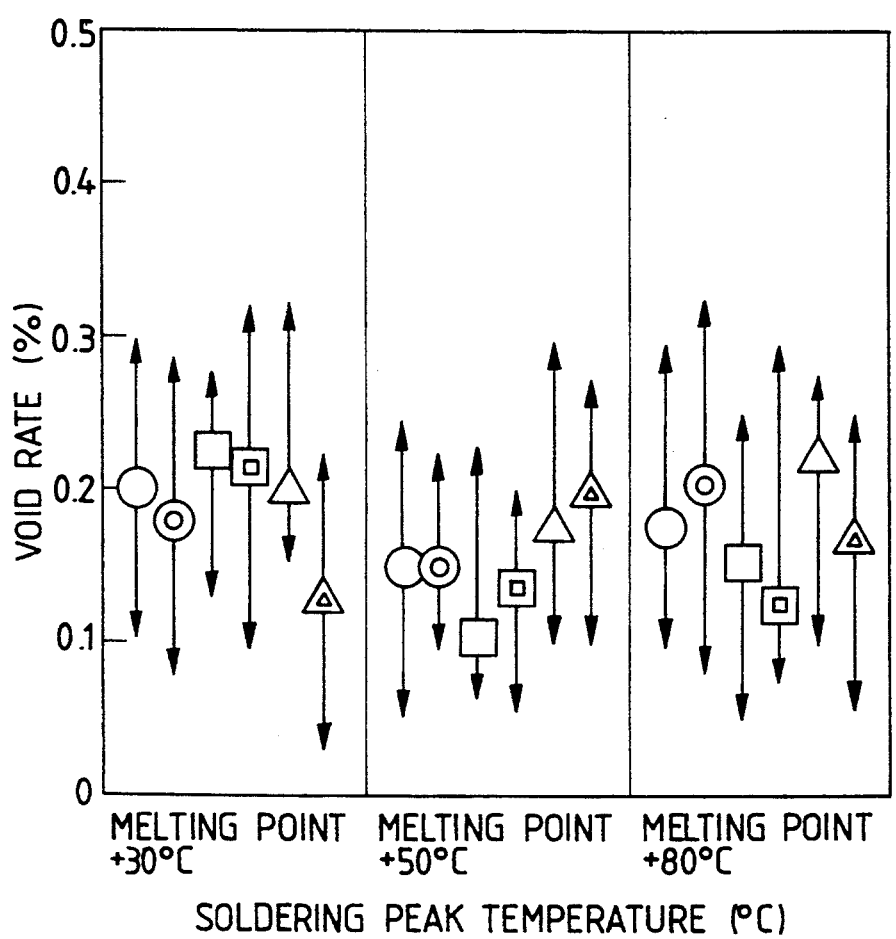
FIG. 8 is a distribution diagram of void rates of joint portions according to the fourth example.

FIGS. 7 and 8 shows the results of measurement of the void rates of joint portions in the same manner as in FIGS. 3 and 4. In this case, solders manufactured one month ago and one year ago were used, and the number of samples was 25 for every solder. As is understood from FIGS. 7 and 8, average rates were not more than 0.25% in any combination of the respective solder materials and the respective soldering temperatures, and the maximum void rate is very low, not more than 0.42%. Further, the difference of the void rates cannot be observed in the case of solders manufactured a long time ago and advanced in surface oxidation, and it means that oxide floats up by the difference of specific gravity when the solder 4 melts in the jig 9, so that the oxide is not mixed to the solder pushed out from the opening portion 10.

According to the present invention, a solid solder is disposed not within a joint area but outside the joint area, and the solder melted by heating is made to permeate the joint area by a capillary phenomenon, so that the void rate in a solder layer of the joint portion can be made not more than 1%. Consequently soldering faults produced by the increase of a thermal resistance value can be reduced on a large scale, so that it is possible to improve the yield of manufacture and to increase the life to thereby improve the reliability. Further, if the thickness of a solder layer after joint is controlled by use of a jig, for example, it is possible to improve the power-cycle proof characteristic of a power transistor.

Further, if a solder standing vertically in its longitudinal direction is melted and supplied to a joint area, pressure caused by self-weight of the melted solder is given thereto, and mixing of oxide of the solder into the melted solder can be avoided, so that it is possible to further reduce the void rate so as to be not more than 0.42 %. In this case, the scope of temperature applicable to soldering is expanded, so that it is easier to manage the process of soldering, and there is no influence of degrees of oxidation of solder surface, so that there is an advantage that troublesome management of solders to be used can be omitted.

What is claimed is:

1. A method of soldering to join two members, comprising the steps of:
   placing surfaces of said members to face each other;
   disposing a solder on at least a portion of at least one of said surfaces adjacent to an area of said surfaces to be joined;
   heating said solder to cause said solder to melt and permeate in said area while restraining said members such that the distance between said member does not exceed a maximum predetermined distance; and
   cooling said members and said molten solder after said molten solder permeates said area.

2. A method according to claim 1, said cooling step comprising supporting said two members such that the distance between said members is not less than a minimum predetermined distance at least after said melted solder permeates said area.

3. A method according to claim 1, in which the quantity of said solder disposed adjacent to said area of said surfaces to be joined is more than a quantity of solid solder having a volume equivalent to the product of said maximum predetermined distance between said two members and said area of said surfaces to be joined.

4. A method according to claim 1, said heating step comprising, when said surfaces are substantially horizontally held, flowing said molten solder between said surfaces due to self-weight of said solder, said solder being disposed on said adjacent area of said surfaces to be joined and being held with the longitudinal axis of said solder being substantially vertical.

5. A method according to claim 4, said cooling step comprising supporting said two members such that the distance between said members is not less than a minimum predetermined distance at least after said melted solder permeates said area.

6. A method according to claim 5, in which the quantity of said solder disposed adjacent to said area of said surfaces to be joined is more than a quantity of solid solder having a volume equivalent to the product of said maximum predetermined distance between said two members and said area of said surfaces to be joined.

7. A method of soldering to join two members, comprising the steps of:
   placing surfaces of said members to face each other;
   disposing a solder between said members in an area of said surfaces to be joined such that said solder keeps the distance between said members larger than a minimum predetermined distance;
   heating said solder to cause said solder to melt and permeate in said area; and
   cooling said members and said molten solder after said molten solder permeates said area while supporting said members such that the distance between said members is not less than said minimum predetermined distance.

8. A method according to claim 7, wherein the quantity of said solder disposed adjacent to said area of said surfaces to be joined is more than a quantity of solid solder having a volume equivalent to the product of said minimum predetermined distance between said members and said area of said surfaces to be joined.

* * * * *